United States Patent [19]

Robertson, Jr. et al.

[11] Patent Number: 5,014,021

[45] Date of Patent: May 7, 1991

[54] FREQUENCY LINEARIZATION CIRCUIT FOR A MICROWAVE VCO IN RIDGED WAVEGUIDE

[75] Inventors: Ralston S. Robertson, Jr., Northridge; John N. Poelker, Simi Valley, both of Calif.

[73] Assignee: Hughes Aircraft Company, Los Angeles, Calif.

[21] Appl. No.: 476,991

[22] Filed: Feb. 8, 1990

[51] Int. Cl.[5] .................. H03B 7/14

[52] U.S. Cl. .................. 331/96; 331/107 DP; 331/177 V

[58] Field of Search .................. 331/36 C, 96, 107 DP, 331/177 V

[56] References Cited

U.S. PATENT DOCUMENTS 4,429,287 1/1984 Robertson, Jr. et al. .... 331/107 DP

*Primary Examiner*—Siegfried H. Grimm

*Attorney, Agent, or Firm*—C. D. Brown; R. M. Heald; W. K. Denson-Low

[57] ABSTRACT

A voltage controlled oscillator having improved frequency linearization characteristics. A radial line, (top-hat) disc geometry in conjunction with a varactor diode are disposed in a broadband, ridged waveguide oscillator circuit to produce a frequency linearized voltage controlled oscillator. A negative resistance device is recessed into the ridged waveguide and coaxially coupled via an impedance transformer to the ridged waveguide cavity. The present invention uses a disc resonator in a ridged waveguide to transform the microwave impedance of a non-RF generating element, a varactor diode, to values which provide improved voltage controlled oscillator tuning linearity. The disc resonator or radial line is located above the varactor diode. The radial line transforms the microave impedance of the varactor diode to a new value which is then coupled into the ridged waveguide circuit and subsequently to the RF generating diode. The circuit impedance, which is a function of the varactor voltage, acts to linearize the frequency versus voltage characteristic of the diode. A comparison of the operation of the circuit with and without the radial line/tuning disc shows a 13:1 improvement in the frequency linearity. Experimental results show that the circuit configuration of the present invention is ideal for use in microwave and millimeter-wave voltage conrolled oscillators which require inherent frequency versus voltage linearity. Since the voltage controlled oscillator frequency linearity is a critical factor in phase locked loop performance, it is especially suited for use in microwave and millimeter-wave radar or communication systems which are frequency agile.

9 Claims, 2 Drawing Sheets

10 16 18 17 11 13 19 12 22 27 26 28 23 25 24 42 2. 33 32 31 13 2.

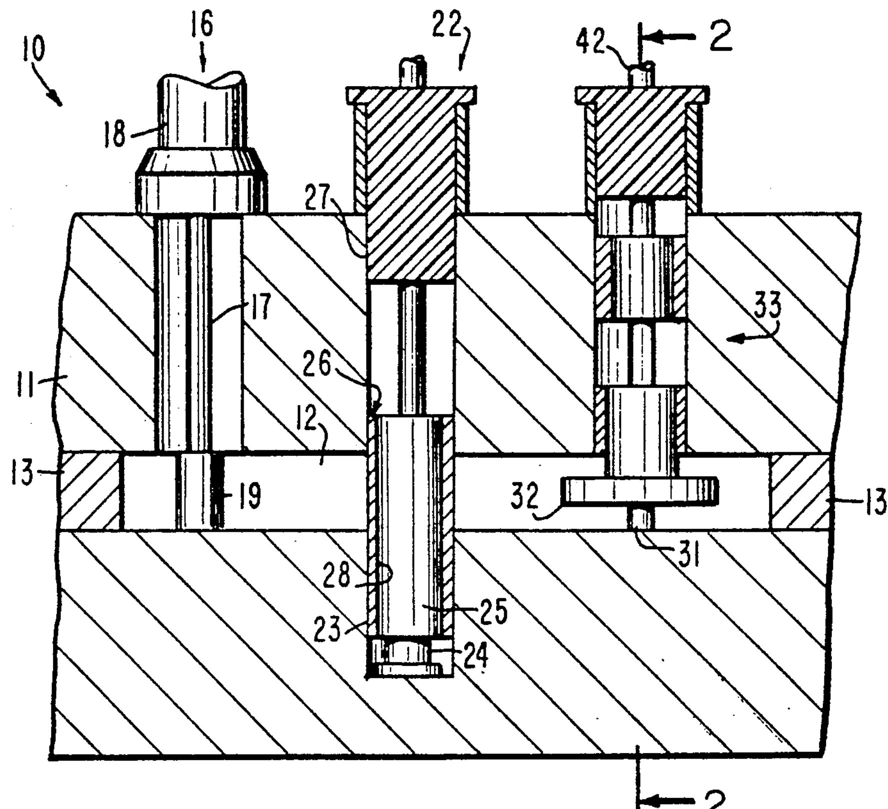
Fig. 1.
Fig. 2.
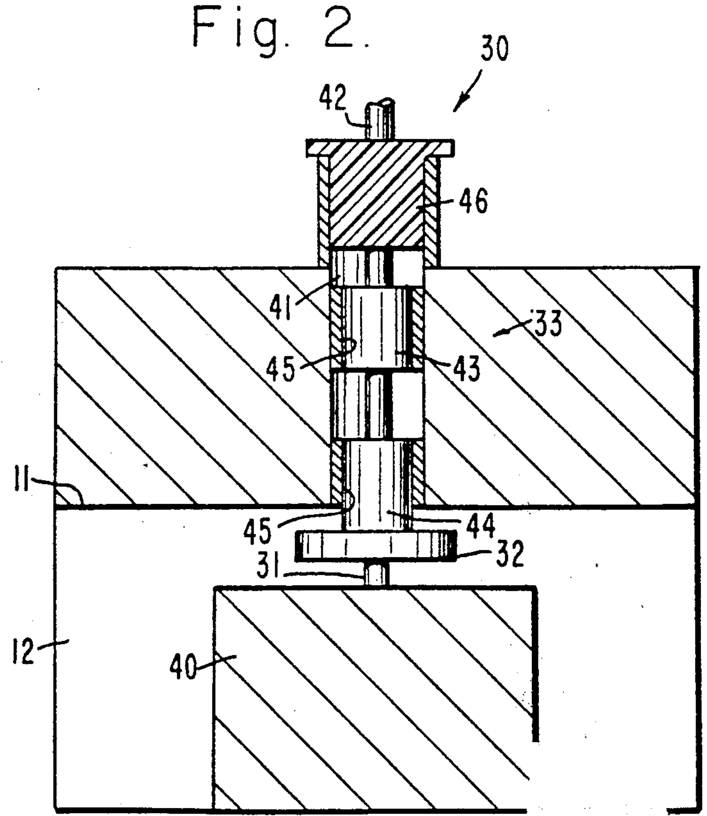
Fig. 3.
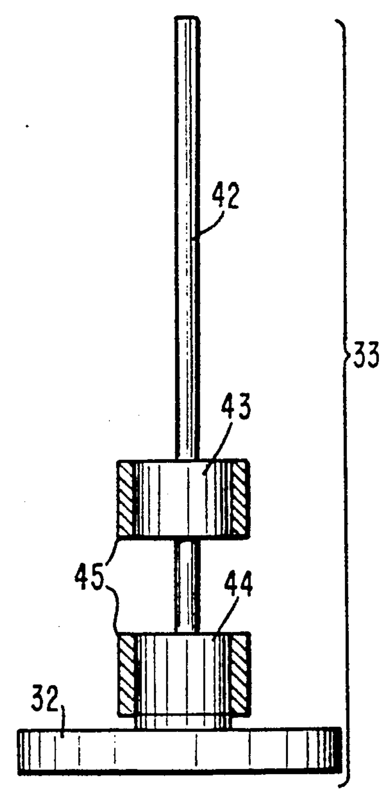

16.5
16.3
16.1
15.9
15.7
15.5
FREQUENCY (GHz)
0
5
10
15
20
25
30
VARACTOR VOLTS 16.5
16.3
16.1
15.9
15.7
15.5
FREQUENCY (GHz)
23.5
22.5
21.5
20.5
19.5
18.5
POWER (dBm)
0
2
4
6
8
10
VARACTOR VOLTS

FREQUENCY LINEARIZATION CIRCUIT FOR A MICROWAVE VCO IN RIDGED WAVEGUIDE

BACKGROUND

This invention relates to microwave and waveguide circuits, and more specifically, to an improvement in a voltage controlled oscillator.

Microwave frequency voltage controlled oscillators find direct application in radar and communication systems which require the use of phase locked loops in the generation of frequency agile signals. The voltage controlled oscillator is the heart of the phase locked loop and is used to set the transmit frequencies of the system. In these systems, the ability to rapidly change frequencies is desirable. The ability of the phase locked loop to lock to a desired frequency is a direct function of the voltage controlled oscillator's frequency versus voltage characteristics, namely, the frequency linearity.

Conventional microwave frequency voltage controlled oscillators lack adequate frequency linearity. Nonlinear voltage controlled oscillator operation requires custom tailored feedback networks to compensate for nonlinear frequency performance. These feedback networks are complicated and reduce the speed at which the phase locked loop locks to a desired frequency. This in turn, causes the entire system to function at a less than optimum speed. The complexity of analog and digital linearization schemes for frequency modulated continuous wave radar applications is also related to the linearity of the master transmitter voltage controlled oscillator.

A disc resonator is commonly used in rectangular waveguides to tune RF generating solid state diodes, such as IMPATT and Gunn diodes, as oscillators. The use of a ridged waveguide to build coaxially coupled, broadband microwave oscillators is disclosed in U.S. Pat. No. 4,429,287, issued to Robertson et al. This patent shows the ridged waveguide as the circuit medium to fabricate a voltage controlled oscillator for microwave and millimeter-wave applications. A disc resonator is employed therein to tune the microwave power generating device.

It is therefore an objective of the present invention to provide an inherently linear voltage controlled oscillator, operating at microwave and millimeter-wave frequencies. A further objective of the present invention is to reduce the complexity of frequency-agile system designs.

SUMMARY OF THE INVENTION

The present invention provides for an improved voltage controlled oscillator having improved frequency linearization characteristics. A radial line, (top-hat) disc geometry in conjunction with a varactor diode are disposed in a broadband, ridged waveguide oscillator circuit to produce a frequency linearized voltage controlled oscillator. Although disc resonators have been used heretofore to tune IMPATT and Gunn diodes in rectangular waveguide, this invention uses the disc resonator in a ridged waveguide to transform the microwave impedance of a non-RF generating element, a varactor diode, to values which provide improved voltage controlled oscillator tuning linearity.

The disc resonator or radial line is located above the varactor diode. The radial line transforms the microwave impedance of the varactor diode to a new value which is then coupled into the ridged waveguide circuit and subsequently to the RF generating diode, an IMPATT or Gunn diode. The circuit impedance, which is a function of the varactor voltage, acts to linearize the frequency versus voltage characteristic of the Gunn or IMPATT diode. A comparison of the operation of the circuit with and without the radial line/tuning disc shows a 13:1 improvement in the frequency linearity.

Experimental results show that the circuit configuration of the present invention is ideal for use in microwave and millimeter-wave voltage controlled oscillators which require inherent frequency versus voltage linearity. Since the voltage controlled oscillator frequency linearity is a critical factor in phase locked loop performanc, it is especially suited for use in microwave and millimeter-wave radar or communication systems which are frequency agile.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 is a broken away side view of a voltage controlled oscillator according to the present invention showing the interior thereof;

FIG. 2 is a view in cross section of the voltage controlled oscillator of FIG. 1 taken along the line 2—2;

FIG. 3 is a detail side view of a disc resonator and a LO-HI-LO transformer section employed in the voltage controlled oscillator of FIGS. 1 and 2;

DETAILED DESCRIPTION

Figure 4:
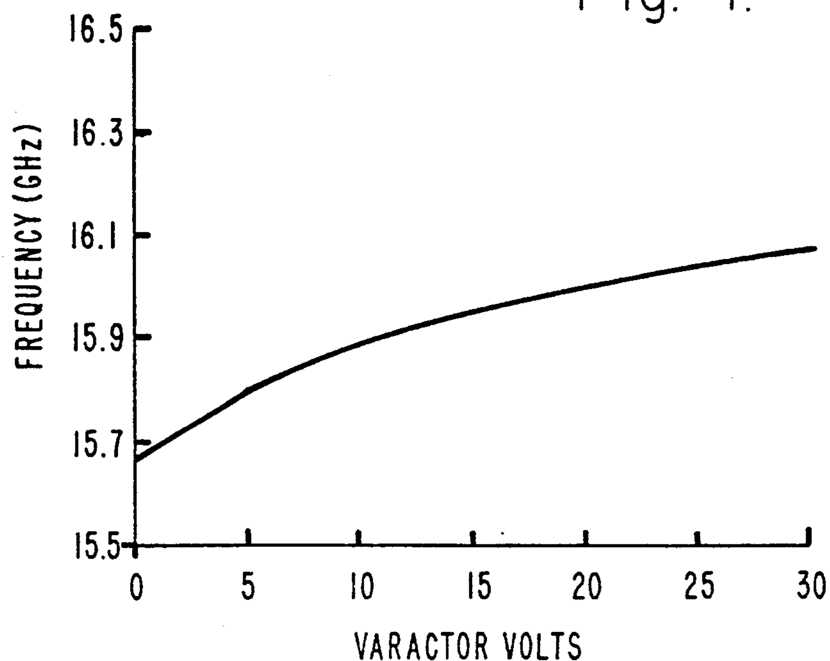
FIG. 4 is a graph depicting the frequency versus varactor voltage curve when the resonator arrangement of the present invention is not used.

Referring now to FIG. 1, there is illustrated a voltage controlled oscillator 10 that operates at microwave and millimeter-wave frequencies and is suitable for use in millimeter-wave radar or communication systems which are frequency agile. The voltage controlled oscillator 10 is constructed in a section of ridged waveguide 11 having a resonant cavity 12 closed at each end by two adjustable waveguide short circuits 13. The voltage controlled oscillator 10 is shown broken away to illustrate the interior construction thereof.

The voltage controlled oscillator 10 is provided with a radio frequency output coupling arrangement 16 located along the centerline of the ridged waveguide 11 near one end thereof. The radio frequency output coupling arrangement 16 is a coaxial output port comprising a center conductor 17 of a 50 ohm coaxial line 18 that serves as an antenna probe disposed within the cavity 12. The center conductor 17 of the coaxial line 18 is terminated with a metal cylinder having an impedance matching step 19.

A coaxial oscillator module 22 is disposed along the centerline of the ridged waveguide 11 adjacent the radio frequency output coupling arrangement 16. A cylindrical recess 23 is provided in the bottom of the ridge of the short circuit waveguide 11. A negative resistance semiconductor device 24 is disposed at the bottom of the cylindrical recess 23 and thus is located at one end of a coaxial transmission line. The negative resistance semiconductor device 24 may be a Gunn device, an IMPATT device, or the like. The coaxial oscillator module 22 has a conductive rod center conductor 25 coaxially inserted into the cylindrical recess 23 above the negative resistance semiconductor device 24.

The center conductor 25 is jacketed by an annular layer of a dielectric material 28 such as Rexolite, or the like. The center conductor 25 extends through the cavity 12 and on out through the upper wall of the waveguide 11. The center conductor 25 is provided with an impedance matching step 26 above the cavity 12. The center conductor 25 passes out of the ridged waveguide 11 through a coaxial radio frequency filter network and through a radio frequency load 27.

The impedance matching step 26 reflects energy at a predetermined desired frequency, while energy at out-of-band frequencies is absorbed in the dissipative radio frequency load 27. The load 27 is a radio frequency tuning load and may be made of ferrite loaded epoxy, or the like. The center conductor 25 provides a path for the DC bias voltage for the negative resistance semiconductor device 24 disposed in the coaxial oscillator module 22.

In accordance with the principles of the present invention, a varactor module 30 is provided in the ridged waveguide 11 along the centerline thereof. The varactor module 30 comprises a varactor diode 31 mounted in the cavity 12 of the ridged waveguide 11 and coupled into the waveguide 11 by means of a disc resonator 32 and a transformer section 33.

Referring now to FIG. 2, there is shown a view taken along the line 2—2 of FIG. 1 through the varactor module 30. In this view, it may be seen how a ridge section 40 provides an inverted U-shaped configuration of the cavity 12 of the ridged waveguide 11. This view shows the varactor diode 31 disposed on top of the ridge section 40 in the center of the waveguide 11. A cylindrical opening 41 is provided in the upper wall of the waveguide 11 above the varactor diode 31. A conductive rod center conductor 42 is disposed coaxially inside the cylindrical opening 41. The center conductor 42 is provided two wider diameter cylindrical steps 43, 44 along the length thereof. The lower cylindrical step 44 is fastened to the disc resonator 32 that is disposed on top of the varactor diode 31.

The center conductor 42 is connected to an external source of a variable voltage which controls the impedance of the varactor diode 31. The two cylindrical steps 43, 44 of the center conductor 42 are jacketed by annular layers of a dielectric material 45 such as Rexolite, or the like. The center conductor 42 passes out of the ridged waveguide 11 through a coaxial radio frequency filter network and through a load 46. The load 46 is a radio frequency tuning load and may be made of ferrite loaded epoxy, or the like. The lower cylindrical step 44 and the resonator 32 together form a structure known as a top-hat. The disc resonator 32 is generally cylindrically shaped and acts as a radial line. The center conductor 42 with its cylindrical steps 43, 44 and the dielectric material 45 comprise the transformer section 33. Although in the present embodiment the center conductor 42 has two cylindrical steps 43, 44, this is by way of example only. It is to be understood that other well known configurations may be employed, if desired, and that the geometry may be a single diameter or any other configuration employed in prior microwave art.

The negative resistance semiconductor device 24 is recessed into the ridge section 40 of the ridged waveguide 11. An impedance matching transformer compressing the center conductor 25 and the jacket of dielectric material 28 provides the optimum transformation of the impedance of the ridged waveguide 11 to the impedance required to sustain oscillation of the negative resistance semiconductor device 24. The microwave energy generated therein propagates up the impedance transformer and into the microwave cavity 12, bounded on both ends by short circuits 13. Upon reaching the cavity 12, the microwave energy encounters the filter network comprising the matching step 26, the center conductor 25, the dielectric material 28 and the load 27. The filter network reflects the energy at the frequency of interest and absorbs all other energy.

Referring now to FIG. 3, there is shown the transformer section 33 of the present invention. FIG. 3 shows the disc resonator 32 with a low-high-low transformer section 33 comprised of the center conductor 42, the two wider diameter cylindrical steps 43, 44 and the dielectric material 45 that forms an annular ring around the cylindrical steps 43, 44. The geometry is not limited to the configuration shown but may have a single step in the center conductor 42, if desired. The transformer section 33 reflects the energy of the fundamental frequency into the cavity 12. The disc resonator 32 transforms the microwave impedance of the varactor diode 31, couples that impedance to the ridged waveguide 11, and ultimately to the negative resistance semiconductor device 24. This impedance transformation provides for more linear tuning of the frequency as a function of varactor voltage. Radio frequency tuning is accomplished by changing the bias voltage applied to the center conductor 42 of the varactor module 30. The radio frequency energy, generated by the negative resistance semiconductor device 24 is coupled by the center conductor 17 of the coaxial line 18 that serves as an antenna probe and by the short circuit 13 into the output coupling arrangement 16 where it then propagates to a load.

Referring now to FIG. 4, the performance of the voltage controlled oscillator 10 when the disc resonator 32 is not employed is shown. Varactor voltage is plotted along the abscissa and frequency in GHz is along the ordinate. FIG. 4 shows that the voltage controlled oscillator 10 exhibits a poor linearity of 60% over a bandwidth of 395 MHz. The varactor voltage tuning range was 0–30 volts. The minimum sensitivity was 6 MHz per volts and the power varied from 22.9 dBm to 21.1 dBm.

Figure 5:
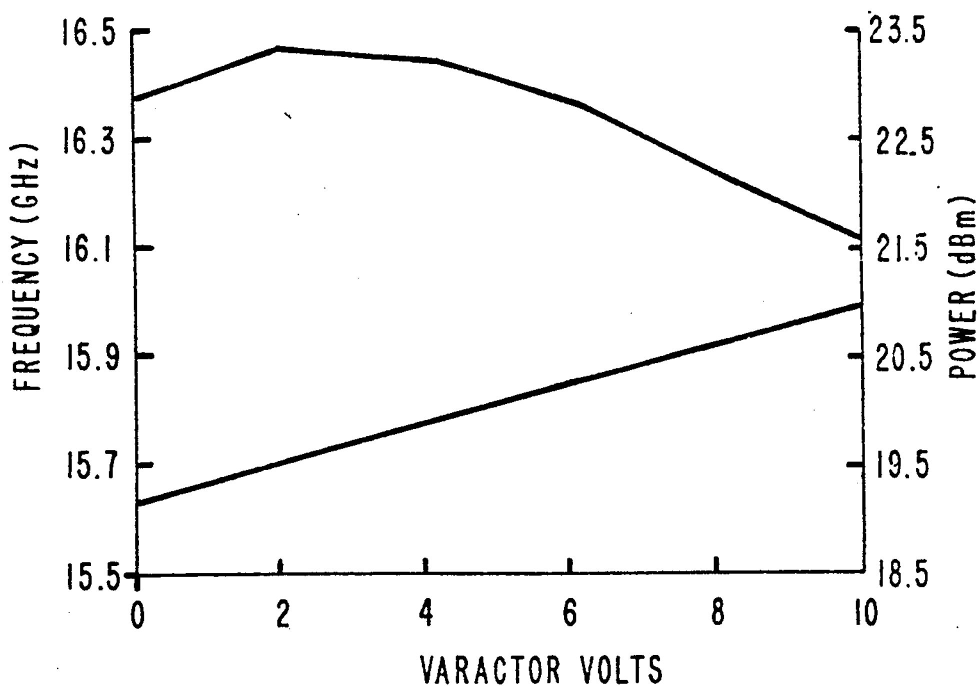
FIG. 5 is a graph depicting the frequency versus varactor voltage curve of the voltage controlled oscillator when using the resonator arrangement of the present invention.

Referring now to FIG. 5, there is shown a graph of the performance of the voltage controlled oscillator 10 when using the disc resonator 32 in accordance with the principles of the present invention. Varactor voltage is along the abscissa and the frequency in GHz is along the ordinate. FIG. 5 shows the performance of the circuit with the disc resonator 32 biasing the varactor diode 31. FIG. 5 shows that the circuit achieves a 4.5% linearity over a 335 MHz bandwidth and a 0–10 volt varactor tuning range. The minimum tuning sensitivity was 64 MHz per volt over the tuning range and the power varied from 22.9 dBm to 21.5 dBm. The test results show a 10:1 sensitivity improvement and a 13:1 linearity improvement when the disc resonator 32 is used as an impedance transformation network with the varactor diode 31. The use of the circuit configuration of the present invention greatly reduces the complexity of voltage controlled oscillator analog and digital linearization schemes for radar applications.

Thus there has been described a new and improved circuit for linearizing a microwave frequency voltage controlled oscillator. It is to be understood that the above-described embodiment is merely illustrative of the many specific embodiments which represent the principles of the present invention. Clearly, numerous and other arrangements can be readily devised by those skilled in the art without departing from the scope of the invention.

What is claimed is:

1. A frequency linearized microwave voltage controlled oscillator circuit comprising:
   - a ridged waveguide having adjustable waveguide shorts disposed at opposite ends thereof to form a cavity;
   - a negative resistance device disposed within the waveguide and adapted to generate microwave frequencies;
   - a coaxial output line coupled to an antenna probe disposed within the waveguide for coupling power to a load;
   - a frequency control module disposed in the waveguide having a top portion adapted to couple to a source of adjustable biasing voltage and having a disc resonator disposed on its bottom most portion; and
   - a variable capacitance device disposed within the waveguide coupled to the bottom waveguide wall and the bottom most portion of the disc resonator as a source of microwave impedance.

2. The frequency linearized oscillator circuit of Claim 1 wherein the frequency control module comprises:
   - a center conductor having a relatively small cross section and having at least one larger cross section portion disposed along a portion thereof, the larger cross section portion having dielectric material disposed around the periphery thereof that forms an annular ring therearound.

3. The frequency linearized oscillator circuit of Claim 1 wherein the frequency control module comprises:
   - a center conductor having a relatively small cross section and having a plurality of larger cross section portions disposed along the extent thereof, the larger cross section portions having dielectric material disposed around the periphery thereof that forms respective annular rings therearound.

4. A frequency linearized microwave voltage controlled oscillator circuit comprising:
   - a ridged waveguide having adjustable waveguide shorts disposed at opposite ends thereof to form a cavity;
   - a negative resistance device disposed within the waveguide and adapted to generate microwave frequencies;
   - a coaxial output line coupled to an antenna probe disposed within the waveguide for coupling power to a load;
   - a frequency control module disposed in the waveguide having a top portion adapted to couple to a source of adjustable biasing voltage and having a disc resonator disposed on its bottom most portion; and
   - a varactor diode disposed within the waveguide coupled to the bottom waveguide wall and the bottom most portion of the disc resonator as a source of microwave impedance;
   - wherein the microwave impedance is transformed by said disc resonator to a new value and coupled into the waveguide and subsequently into the negative resistance device thereby linearizing the frequency versus voltage output of said microwave voltage controlled oscillator.

5. The frequency linearized oscillator circuit of Claim 4 wherein the frequency control module comprises:
   - a center conductor having a relatively small diameter and having at least one larger diameter cylindrical portion disposed along a portion thereof, the larger diameter cylindrical portion having dielectric material disposed around the periphery thereof that forms an annular ring therearound.

6. The frequency linearized oscillator circuit of Claim 4 wherein the frequency control module comprises:
   - a center conductor having a relatively small diameter and having a plurality of larger diameter cylindrical portions disposed along the extent thereof, the larger diameter cylindrical portions having dielectric material disposed around the periphery thereof that forms respective annular rings therearound.

7. A frequency linearized microwave voltage controlled oscillator circuit comprising a ridged waveguide having adjustable waveguide shorts disposed at opposite ends thereof to form a cavity, a negative resistance device disposed within the waveguide and adapted to generate microwave frequencies, a coaxial output line coupled to an antenna probe disposed within the waveguide for coupling power to a load, wherein the improvement comprises:
   - a frequency control module disposed in the waveguide having a top portion adapted to couple to a source of adjustable biasing voltage and having a disc resonator disposed on its bottom most portion; and
   - a variable capacitance device disposed within the waveguide coupled to the bottom waveguide wall and the bottom most portion of the disc resonator as a source of microwave impedance;
   - wherein the microwave impedance is transformable by said disc resonator to a new value and coupled into the waveguide and subsequently into the negative resistance device thereby linearizing the frequency versus voltage output of said microwave voltage controlled oscillator.

8. The frequency linearized oscillator circuit of Claim 7 wherein the frequency control module comprises:
   - a center conductor having a relatively small diameter and having at least one larger diameter cylindrical portion disposed along a portion thereof, the larger diameter cylindrical portion having dielectric material disposed around the periphery thereof that forms an annular ring therearound.

9. The frequency linearized oscillator circuit of Claim 7 wherein the frequency control module comprises:
   - a center conductor having a relatively small diameter and having a plurality of larger diameter cylindrical portions disposed along the extent thereof, the larger diameter cylindrical portions having dielectric material disposed around the periphery thereof that forms respective annular rings therearound.

* * * * *